United States Patent [19]
Chan

[11] Patent Number: 5,773,875
[45] Date of Patent: Jun. 30, 1998

[54] HIGH PERFORMANCE, LOW THERMAL LOSS, BI-TEMPERATURE SUPERCONDUCTIVE DEVICE

[75] Inventor: Hugo Wai-Kung Chan, Rancho Palos Verdes, Calif.

[73] Assignee: TRW Inc., Redondo Beach, Calif.

[21] Appl. No.: 606,177

[22] Filed: Feb. 23, 1996

[51] Int. Cl.[6] .......................... H01L 39/00; H01L 23/34; H04B 1/00
[52] U.S. Cl. ...................... 257/661; 257/662; 257/716; 505/703; 505/856
[58] Field of Search ................................. 257/661, 662, 257/716; 505/220, 234, 330, 703, 856, 866

[56] References Cited

U.S. PATENT DOCUMENTS

| | | | |
|---|---|---|---|
| 4,809,133 | 2/1989 | Faris et al. | 361/385 |
| 5,430,012 | 7/1995 | Nakamura et al. | 505/234 |
| 5,567,673 | 10/1996 | Face et al. | 505/329 |

OTHER PUBLICATIONS

Hammond, Robert B., et al., *High–Tc Microwave Superconductors and Applications,* (Abstract Only), SPIE Proceedings vol. 2156, 235p., Jan. 26 & 27, 1994.

*Primary Examiner*—Wael Fahmy
*Assistant Examiner*—Howard Weiss
*Attorney, Agent, or Firm*—Michael S. Yatsko

[57] ABSTRACT

A superconductive electrical device is operable simultaneously at relatively higher temperatures, i.e., 60–90K, and at relatively lower temperatures, i.e., less than 12K. The device comprises a non-superconductive substrate with two regions, a first relatively high temperature region and a second relatively low temperature region. A high temperature superconductor is on the first region and a portion of the second region. A dielectric layer is on the high temperature superconductor. A low temperature superconductor is on the second region of the substrate and on a portion of the dielectric layer. Integrated circuit chips can be secured to both superconductors, thereby yielding a superconductive multi-chip module operable at two different temperatures, such as in a cryo-cooler with two temperature stages.

38 Claims, 3 Drawing Sheets

HIGH PERFORMANCE, LOW THERMAL LOSS, BI-TEMPERATURE SUPERCONDUCTIVE DEVICE

BACKGROUND

The present invention is directed to improvements in superconductive electrical devices.

Electrical devices utilizing superconductive materials have important applications, including high-speed supercomputing and digital processing, high-performance network switching, analog to digital converters, RF filters, resonators, and low-loss transmission lines.

For space applications it is necessary that superconductive devices be low weight to minimize launch costs, and reliable, since repair in space is extremely difficult. Superconductive devices are particularly useful for satellite applications, because of the intrinsic lower power dissipation and the potential low cryo-cooler temperature.

Some systems utilizing superconductive devices operate simultaneously at two different temperatures, which can differ by 20° K or more. Low temperature superconductive (LTS) devices operate at relatively low temperatures, generally less than 12° K, while high temperature superconductive (HTS) devices operate at relatively "higher" temperatures, generally in the order of 30°–90° K. Typical low temperature superconductors are niobium, operating at about 4° K, and niobium nitride, operating at about 8°–12° K. Circuits that use both LTS and HTS devices require an interface across the temperatures gradient. The interface needs to have low loss of electrical signal and low thermal loss.

Prior attempts to interconnect between HTS electronics and LTS electronics have suffered from disadvantages. Typically electrical ribbon cables comprised of high electrical conductivity metal, such as copper or aluminum, have been tried. Although these cables have good electrical properties, they have relatively poor thermal characteristics because of the high thermal conductivity of the metals. This results in undesirable heat transfer from the HTS electronics to the LTS electronics. Attempts to use alloy wires with lower thermal conductivity, such as Constantan, are an improvement over common metal wires, but still have significant heat loss.

Besides exhibiting low thermal loss, a satisfactory interface also requires low electrical signal distortion and low attenuation.

Accordingly, there is a need for an electrical device that serves as an interconnect, being operable simultaneously at relatively higher and relatively lower superconductive temperatures, and which has low heat loss, and low attenuation and distortion of electrical signals transmitted between the two temperature environments.

SUMMARY

The present invention is directed to a superconductive electrical device that satisfies this need. The device is operable at relatively higher ambient temperatures and relatively lower ambient temperatures, differing by at least 20° K. The device comprises a non-superconductive substrate, typically a ceramic material. The substrate has two regions, a first high temperature region and a second low temperature region. A first superconductive layer is placed on the first region and on a portion of the second region of the substrate. The first layer is an HTS material. A dielectric layer is on the first superconductive layer. A second superconductive layer, a LTS, is on the second low temperature region of the substrate and on a portion of the dielectric layer. The second layer is superconductive in the relatively low temperature range, but not in the relatively high temperature range. Both or either of the superconductive layers can be patterned and etched, and provided with via contacts. To ensure good, low resistance electrical contact between the LTS and HTS layers, an optional interface metal layer can be added between the superconductive layers at the via contacts so that they are interconnected by the metal layer.

This device can be used as a building block for a multi-chip-module for connecting integrated circuit (IC) chips to the superconductive layers.

Additional HTS layers can be deposited on the top of the first HTS layer, to form electrical devices such as microstrip transmission lines. Between each of the HTS layers is a non-superconducting layer.

Devices according to the present invention can be used in a cryo-cooler having a first relatively higher temperature cooling stage and a second relatively lower temperature cooling stage. The HTS layer is proximate to the first stage and the LTS layer is proximate to the second stage. A portion of the HTS layer extends into the low temperature stage. Preferably the device is oriented so that the IC chips are proximate to the cooling stages.

DRAWINGS

These and other features, aspects, and advantages of the present invention will become better understood from the following description, appended claims, and accompanying drawings where:

DESCRIPTION

Figure 1:
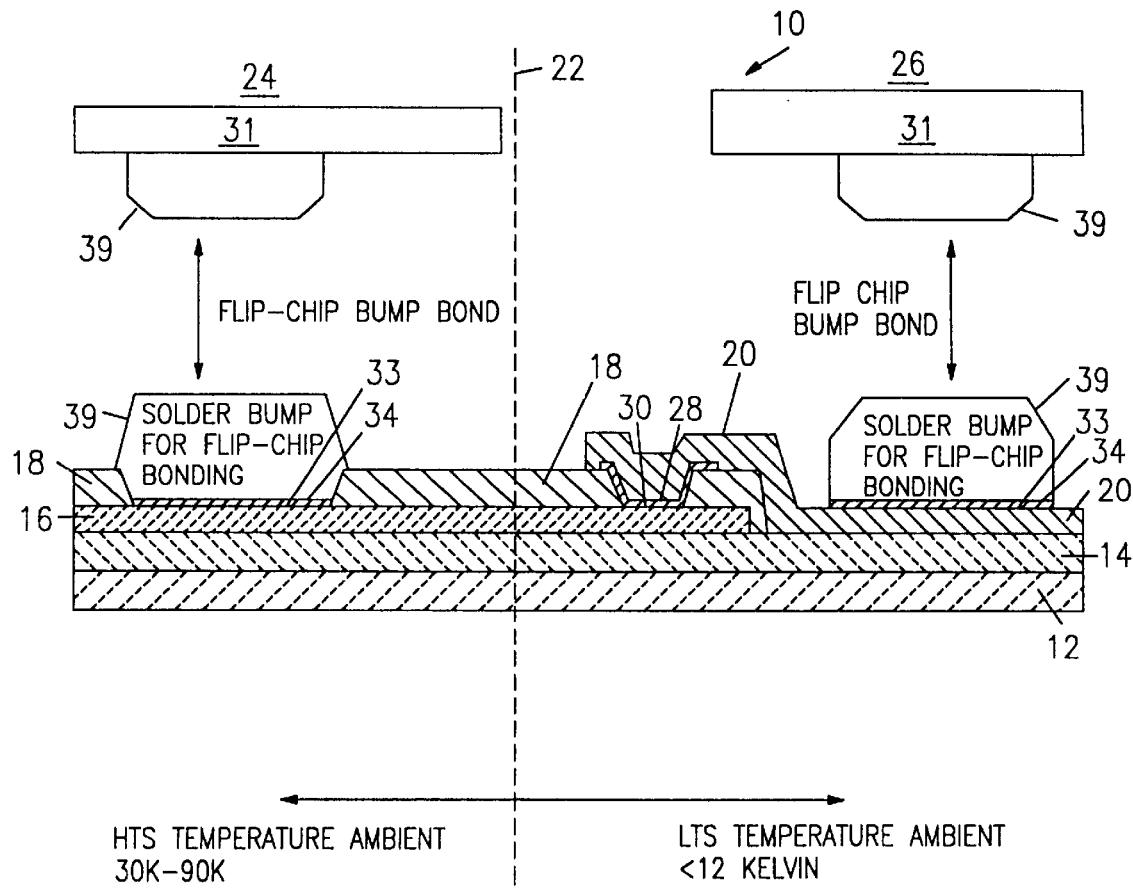
FIG. 1 is a schematic view, in longitudinal section, of an electrical device according to the present invention.

With reference to FIG. 1, an electrical device 10 is operable both at relatively low superconductive temperatures and at relatively high superconductive temperatures. The device 10 comprises (i) a substrate, typically a ceramic substrate 14, (ii) an optional ground plane 12 on a first side of the substrate; (iii) a high temperature superconductor layer 16 on the opposite side of the ceramic substrate; (iv) a dielectric layer 18 on the HTS layer; and (v) a low temperature superconductive layer 20 on the dielectric layer 18. Dashed line 22 in FIG. 1 delineates two regions of the device, a high temperature region 24, operable at a temperature at which HTS materials are superconductive, and a low temperature region 26, operable at temperatures at which LTS materials are superconductive.

The HTS layer 16 extends across the interface 22 between the two regions. The HTS layer 16 is used rather than the LTS layer 20 for this purpose, because the LTS layer 20 is usually made out of a metal, which has high thermal conductivity which would result in undesirable heat transfer from the high temperature region 24 to the low temperature region 26. Since the HTS layer 16 is typically made out of a ceramic, with very low thermal conductivity, there is little heat transmission from the high temperature region 24 to the low temperature region 26. Another reason for using the HTS layer to cross the barrier 22 is that the HTS is typically superconductive at the temperatures at which the LTS is superconductive, but the LTS is not superconductive at the temperatures present in the high temperature region 24.

Optionally, to provide good electrical contact between the LTS and HTS layers, a via 28 can be formed in the dielectric layer 18, and a metal interface 30, which is a thin, electrically conductive metal layer, can be provided between the LTS and HTS layers. Typically the interface layer 30 is made of a noble metal such as silver or gold.

The ground plane 12 is generally made of a high temperature superconductive material. Among the materials that can be used are yttrium-barium-copper-oxide, bismuth-strontium-calcium-copper oxide, thallium-barium-calcium-copper-oxide, and other high temperature copper oxide superconductors. Generally the ground plane 12 is from about 1000 to about 10000 Å thick.

The substrate 14 is typically a ceramic material, generally is planar, generally has a thickness of from about 5 to about 30 mils (1 mil equals 0.001 inch), and provides structural support. A thin substrate is desirable because the substrate crosses the thermal barrier, and thus heat can be transmitted through it. The thinner the substrate, the less heat it conducts. The substrate can be thinned using a lapping/polishing technique; wet chemical etching or other similar surface polishing can be employed to remove surface damage caused by the thinning.

The substrate can be made of material such as strontium titanate, lanthanum aluminate, magnesium oxide, cubic zirconia, neodymium gallate, or buffered substrates such as yttrium stabilized zirconium buffered with cerium oxide. It can also be formed of the same material used for the HTS layer, buffered with a ceramic oxide layer. The material of the substrate 14 is chosen to have crystal structure and electrical compatibility with the overlying HTS layer 16. Preferably the HTS layer 16 is epitaxially grown on the substrate at a temperature of about 800° C., with lattice constants that closely match the lattice constants of the substrate 14.

Preferably the HTS is an oxide-based superconductive material, and more preferably a copper-oxide-based superconductive material, such as yttrium-barium-copper-oxide (Y—Ba—Cu—O), bismuth-strontium-calcium-copper-oxide (Bi—Sr—Ca—Cu—O), thallium-barium-calcium-copper-oxide (Tl—Ba—Ca—Cu—O), and mercury copper oxide-based superconductive compounds.

It is desirable that the HTS layer 16 and the ground plane layer 12 be as thin as practical, without adversely affecting their structural integrity and electrical properties, to minimize heat leakage from the high temperature region 24 to the low temperature region 26 of the device 10. Preferably the HTS 16 layer has a thickness of no more than about 1 micron, and even more preferably no more than about 5000 Å.

The dielectric layer 18 can be made of: (1) the same ceramic oxide materials used for the substrate layer 14; (2) any of the superconductive materials used for the HTS layer 16, but doped so that they lose their superconductive electrical properties, such as by doping yttrium-barium-copper-oxide with cobalt or calcium; or (3) conventional amorphous dielectric such as silicon dioxide or silicon nitride. An advantage of using a doped material is that there is assurance that the chemical and structural compatibility needed between the dielectric layer 18 and the HTS layer 16 can be realized. A preferred material is silicon dioxide since it is inexpensive and readily available.

Preferably the dielectric layer 18 has a dielectric constant of less than about 100, and more preferably less than about 30.

Because the dielectric layer 18 also crosses from the high temperature region 24 to the low temperature region 26, it preferably is no more than 5 microns thick, and more preferably no more than 1 micron thick.

The LTS layer 20 is made from a low temperature superconductive material, and is generally a metal. Preferred materials are niobium, and niobium nitride.

FABRICATION METHOD

Figure 4:
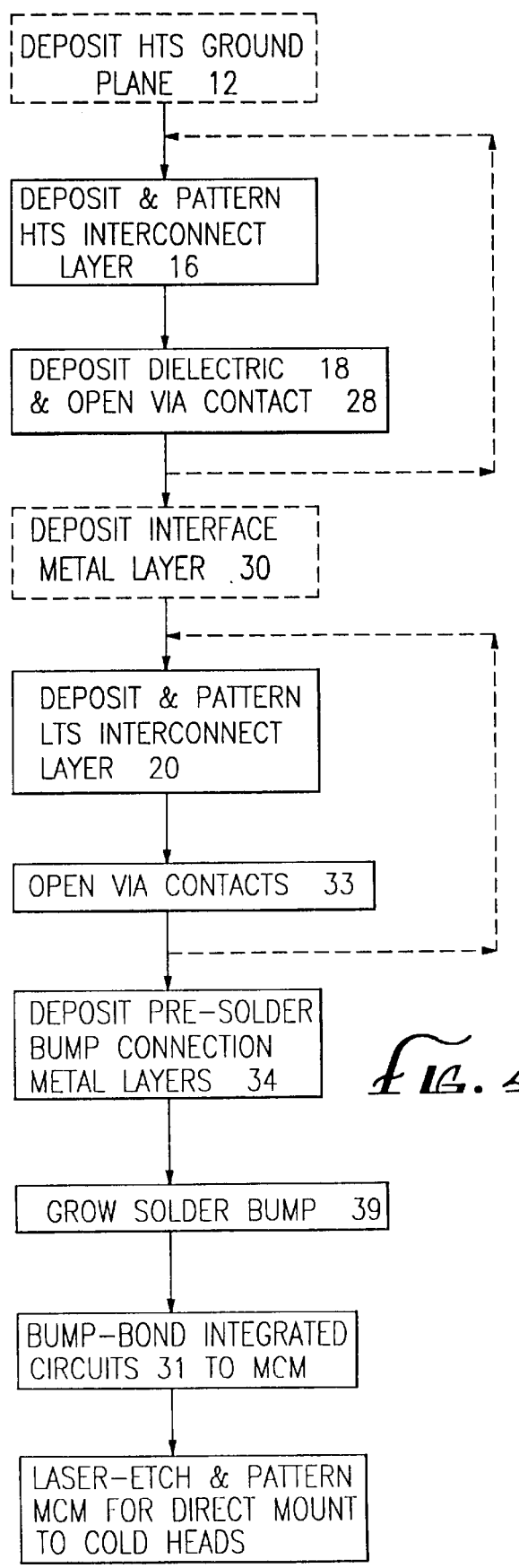
FIG. 4 shows the sequential steps used in making an electrical device according to the present invention, where optional steps are in a dashed box.

With reference to FIG. 4, there will now be explained suitable methods for fabricating the electrical device 10, including methods claimed as part of this invention.

The optional ground plane layer 12, the HTS layer 16, and the dielectric layer 18 are sequentially deposited on the substrate 14 using conventional thin-film deposition techniques such as laser ablation, sputtering, molecular beam epitaxy (MBE), metal organo-chemical vapor deposition (MOCVD), co-evaporation, LPCVD (low pressure chemical vapor deposition) or other similar techniques. The HTS layer 16 can be patterned and provided with selected via contacts, using standard etching techniques such as ion milling, reactive ion etching, wet chemical etching, and similar methods.

Figure 2:
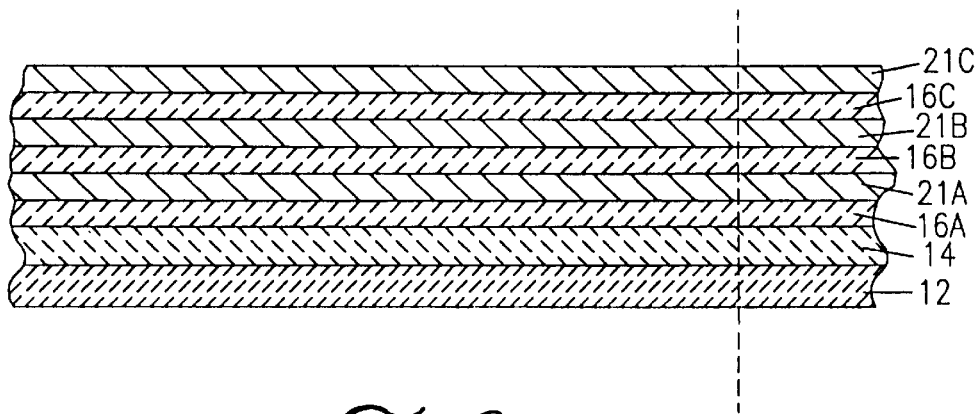
FIG. 2 shows a portion of the high temperature region of a device according to the present invention, where the high temperature region has a plurality of bilayers, each comprising an HTS layer and a dielectric layer.

In the version of the invention shown in FIG. 2, multiple bilayers of HTS and dielectric are sequentially deposited. Thus, in FIG. 2, HTS layer 16A and intermediate dielectric layer 21A form one bilayer, HTS layer 16B and intermediate dielectric layer 21B form a second bilayer, and HTS layer 16C and dielectric layer 21C form a third bilayer. This optional deposition of bilayers is shown by dashed line 25 in FIG. 4. The intermediate dielectric layers 21A and 21B can be made of the same material as the top dielectric layer 14 except they cannot be made of (3) amorphous materials because they need structural compatibility with the adjacent HTS layers 16. In other words, the intermediate dielectric layers 21A and 21B can be made of (1) ceramic oxide materials and (2) superconductive materials doped to lose their superconductive electrical properties. The outermost dielectric layer 21C can be made of amorphous material.

The optional ground plane layer 12 is deposited on the side of the substrate 14 opposite from the HTS layer 16 for making a microstrip transmission line or other devices.

The substrate thickness 12 can be thinned from typically 20 mil thickness to thinner thicknesses to reduce the impedance of the transmission line, using lapping or other mechanical-chemical polishing techniques.

Another technique for fabricating devices having multiple HTS and dielectric layers is described in co-pending U.S. patent application Ser. No. 08/503,682, filed on Jul. 18, 1995, entitled "MULTI-LAYERED SUPERCONDUCTIVE INTERCONNECTS" (TRW Docket No. 11-0715), by H. Chan et al., which is incorporated herein by reference.

As shown in FIG. 1, the dielectric layer 18 extends over the entire top surface of the HTS layer 16 and onto the ceramic substrate 14 in the low temperature region 26.

The optional interface layer 30 is then deposited. This is effected by first etching one or more vias 28 in the dielectric layer 18 using any of the etching techniques identified above, and then applying a very thin layer 30 of metal, such as a noble metal, i.e., gold or silver. The contact interface layer 30 is typically from about 50 to about 5000 Å thick, and generally less than about 2000 Å thick. After the interface layer 30 is deposited, preferably it is subject to a low temperature anneal, generally for about 10 minutes to less than an hour, with a minimum temperature of 100° C., and preferably about 400 to 500° C. This helps reduce contact resistance. The goal is to have a contact resistance between the LTS layer 20 and the HTS layer 16 of less than 1 ohm for a 100×100 micron contact.

The LTS interconnect layer 20 is then deposited, using thin-film deposition techniques such as sputtering, or e-beam evaporation.

The LTS layer 20 is patterned and then prepared for securing integrated circuit chips (IC chips) 31. In regions in which IC chips 31 are to be bonded to the HTS layer, the dielectric layer is etched to provide vias 33 using any of the techniques described above. A metal connect layer 34 such as gold, silver, palladium, or platinum, with or without an adhesion promoting layer such as titanium, can be deposited directly. The connect layer 34 can be deposited by sputtering, electron beam evaporation, thermal evaporation, or similar techniques.

Next, the integrated circuit chips 31 are bonded to the interconnect layer 34 using conventional flip-chip bump-bonding techniques. The preferred solder is indium tin alloy solder. The exposed bond part regions of the device to be bonded, or the IC chips 31, or both, are dipped in the solder to form solder bumps 39, and then aligned with a flip-chip aligner, pushed together, heated, and then cooled. In other words, the substrate to be bumped is dipped into a solder pot, with or without pre-dipped solder flux to grow the solder bumps 39.

The IC chips 31 bonded to the HTS layer 16 are typically silicon IC chips such as CMOS. Other IC chips such as GaAs or InP, semi-conductor or HTS integrated circuit chips can be used. The IC chips bonded to the LTS layer 20 are typically silicon IC chips such as CMOS. Other IC chips such as GaAs or InP, LTS integrated circuit chips can be used.

Figure 3:
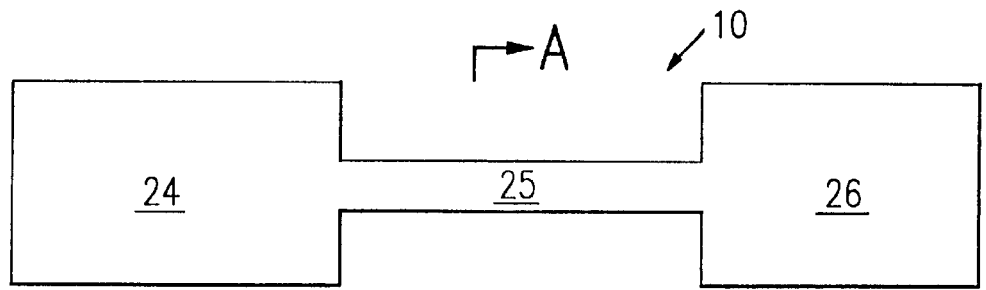
FIG. 3 is a top plan view of the device of FIG. 1.

As shown in FIG. 3, an intermediate region 25 between the high temperature region 24 and the low temperature region 26 of the device 10 can be shaped mechanically or uses laser-cutting to have minimum width, and thus minimum cross-sectional area to minimize the heat leakage into the low temperature region 26 from the high temperature region 24. The intermediate region 25 can be a narrow strip connecting regions 24 and 26.

Preferably the cross-sectional area of the intermediate region 25 is reduced by at least 20%, more preferably by at least 40%, and most preferably by at least 60% compared to regions 24 and 26 for minimal heat leakage. By "cross-sectional area" there is meant the area of the intermediate section 25 taken on line A—A in FIG. 3.

Figure 5:
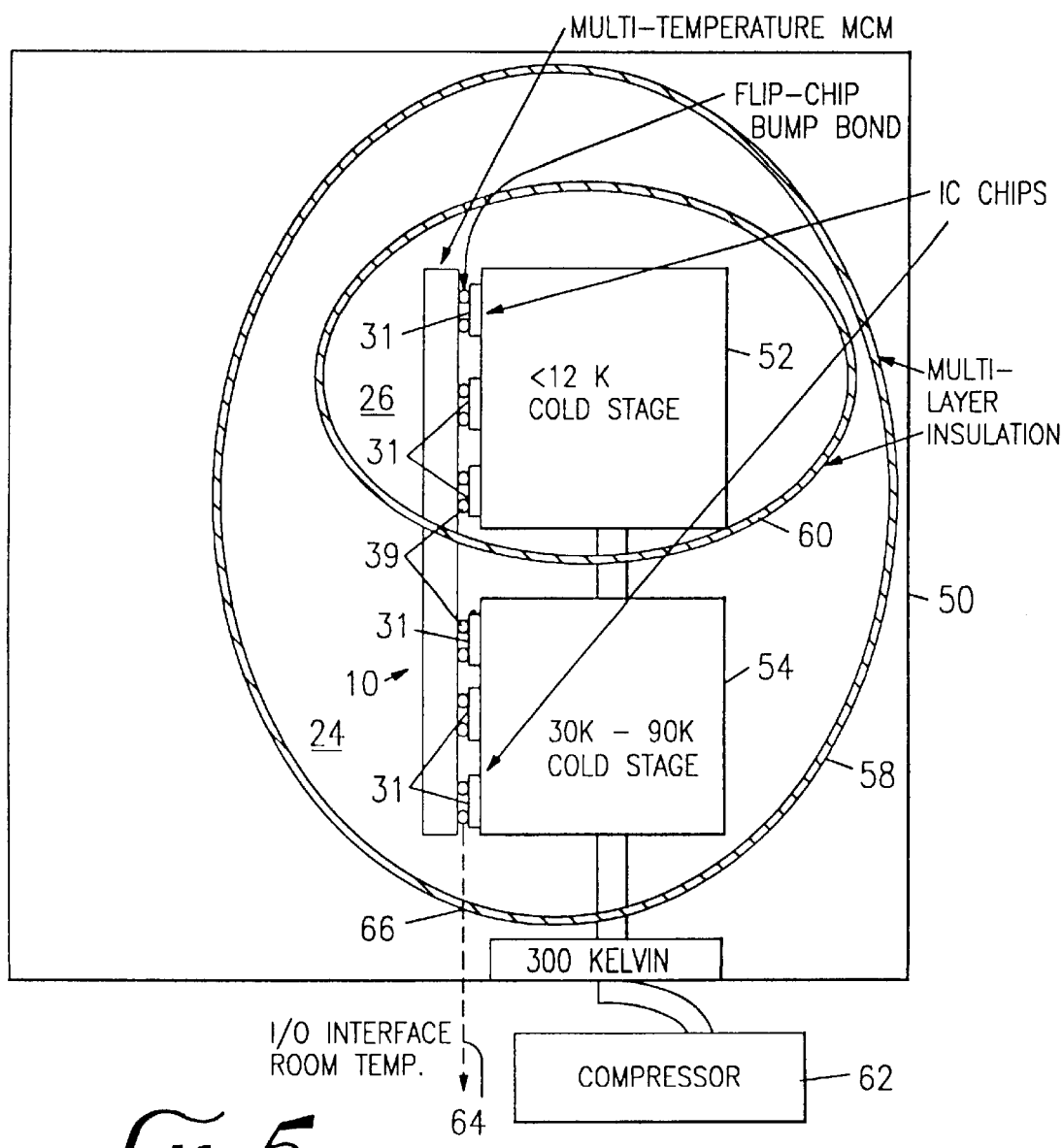
FIG. 5 schematically shows an electrical device according to the present invention in a cryo-cooler.

The device 10 with mounted IC chips 31 is known as a superconductive MCM (multi-chip-module) structure. The multi-temperature MCM with the mounted integrated circuits can be inserted into a cryo-cooler 50, as shown in FIG. 5. The typical cryo-cooler can be a multi-stage Stirling or pulse tube cryo-cooler based on compressor 62 and displacer/regenerator design. The cryo-cooler 50 has a secondary cold stage (cold head) 52, typically operating at less than 12° K, and cooled by a relatively warmer first stage 54, referred to herein as an intermediate temperature stage, operating at greater than 30° K, and typically from about 60°–90° K. The two stages are in a housing, and are insulated from the environment by environmental insulation and radiative shields 58, and are insulated from each other by multi-layer thermal insulation 60. The cryo-cooler chamber 50 is typically anchored at room temperature and maintained under vacuum.

As shown in FIG. 5, the multi-temperature MCM 10 is oriented with the integrated circuits proximate to the cold stage 52 and the intermediate stage 54. The low temperature region 26 of the MCM module 10 is proximate to the cold stage 52, and the high temperature region 24 of the MCM module 10 is proximate to the intermediate temperature stage 54. Preferably, the integrated circuits are in direct thermal and physical contact with their respective stages. This is particularly valuable since the IC chips can include a silicon substrate, which is a good thermal conductor. By having the IC chips oriented as shown in FIG. 5, better cooling is obtained for the entire MCM module than if the orientation were reversed with the substrate 14 or ground plane 12 in contact with the cooling stages.

Mechanical support to the device 10 is provided by the cold stages 52 and 54 in this orientation. This allows the various layers of the device 10 including the substrate 14 to be thinned down, if desired, to further reduce heat loss.

In the cryo-cooler 50, optional heat sinking to the integrated circuit chips can be provided by using an additional cold strap (not shown in the figures) from the cold stages 52 and 54 to the side of the MCM device where the integrated circuits are bonded.

Electrical interface 64 to device 10 can be made using low thermal conductive electrical wires. Optionally, as shown in FIG. 5, the MCM device 10 can be extended all the way to room temperature ambient and provide the interface from the intermediate temperature stage 54 to room temperature. This is schematically shown by dashed line 64 in FIG. 5. This can be effected by etching a via in the dielectric layer 18, and depositing on the dielectric layer and into the via a low thermal conductivity metal alloy film 66, where the film crosses the barrier from the intermediate temperature stage 54 to room temperature. Suitable metal alloy films are Constantan.

Devices according to the present invention have significant advantages. The MCM device 10 provides an electrical conduction path and a thermal barrier between cold and intermediate temperatures. The low thermal conductivity of the HTS layer 16 and the substrate materials, and the excellent electrical properties of the HTS layer 16, yield an ideal input/output interface. Because of the stable mechanical support provided by the cold stage 52 and intermediate stage 54 of the cryo-cooler, the MCM substrate 14 thickness can be thinned to minimize heat conduction. Moreover, the substrate 14 can be cut, using such techniques as laser cutting, to minimize the interface cross-sectional area, as shown in FIG. 3.

The MCM device 10 is a superior system compared to wire-bonding between superconductive devices operating at different temperatures. The proposed arrangement improves cryo-cooler efficiency, and minimizes power dissipation. Moreover, signal degradation/reflection that occurs with wire-bonding due to impedance mismatches among IC chips can be avoided.

The present invention provides signal integrity of multi-chip modules for high-speed and high-frequency applications, and yields low thermal loss and a high-quality electrical interface between two cold temperature ambients. Another advantage of the present invention is that there is effective-heat sinking of integrated circuit chips through direct contact to the stages of a cryo-cooler. Improved cryo-cooler efficiency results because of reduced loss at cold temperatures as a result of interface penetration. Another advantage is that the device 10 provides compact packaging, low weight, and integration of integrated circuit chips operating at different temperatures.

As a result of these advantages, reduction in the weight of the MCM, and also reduction of the power and weight of the cryo-cooler result. These reductions in weight are critical for spacecraft payload applications, such as satellites. It is estimated the cost of placing a satellite in space is about $100,000 per pound.

Although the present invention has been described in considerable detail with reference to certain preferred versions thereof, other versions are possible. Therefore, the spirit and scope of the appended claims should not be limited to the description of the preferred versions contained herein.

What is claimed is:

1. A superconductive electrical device operable simultaneously at a relatively higher temperature and at a relatively lower temperature differing by at least 20° K, the device comprising:
   (a) a non-superconducting substrate having a first relatively higher temperature region and a second relatively lower temperature region;
   (b) a first superconductive layer on the first region and on a portion of the second region of the substrate, the first layer being superconductive at the relatively higher temperature;
   (c) a dielectric layer on the first superconductive layer; and
   (d) a second superconductive layer on the second region of the substrate and on a portion of the dielectric layer, the second layer being superconductive at the relatively lower temperature but not at the relatively higher temperature.

2. The device of claim 1 including securing means on at least one of the superconductive layers for securing at least one integrated circuit chip thereto.

3. The device of claim 2 wherein the securing means comprises bond contacts on the first superconductive layer.

4. The device of claim 1 comprising integrated circuit chips secured to at least one of the superconductive layers.

5. The device of claim 4 wherein each superconductive layer has an integrated circuit chip secured thereto.

6. The device of claim 1 wherein the substrate is ceramic.

7. The device of claim 1 including a ground plane under the substrate.

8. The device of claim 1 wherein the first superconductive layer is patterned.

9. The device of claim 1 wherein the second superconductive layer is patterned.

10. The device of claim 1 comprising an electrically conductive, metal, interconnect layer directly connecting the first and second superconductive layers.

11. The device of claim 1 wherein the relatively lower temperature is less than 12K, and the relatively higher temperature is greater than 30K.

12. The device of claim 1 wherein the first and second superconductive layers are electrically connected.

13. A superconductive electrical device operable simultaneously at a relatively higher temperature and at a relatively lower temperature differing by at least 20° K, the device comprising:
   (a) a non-superconducting substrate having a first relatively higher temperature region and a second relatively lower temperature region;
   (b) a first superconductive layer on the first region and on a portion of the second region of the substrate, the first layer being superconductive at the relatively higher temperature;
   (c) a dielectric layer on the first superconductive layer; and
   (d) a second superconductive layer on the second region of the substrate and on a portion of the dielectric layer, the second layer being superconductive at the relatively lower temperature but not at the relatively higher temperature,
   wherein the first and second regions are connected by an intermediate region, the cross-sectional area of the intermediate region being at least 20% less than the cross-sectional area of the first region.

14. A superconductive electrical device operable simultaneously at a relatively higher temperature and at a relatively lower temperature differing by at least 20° K, the device comprising:
   (a) a non-superconducting substrate having a first relatively higher temperature region and a second relatively lower temperature region;
   (b) a first superconductive layer on the first region and on a portion of the second region of the substrate, the first layer being superconductive at the relatively higher temperature;
   (c) a dielectric layer on the first superconductive layer; and
   (d) a second superconductive layer on the second region of the substrate and on a portion of the dielectric layer, the second layer being superconductive at the relatively lower temperature but not at the relatively higher temperature,
   wherein the first and second regions are connected by an intermediate region, the cross-sectional area of the intermediate region being at least 20% less than the cross-sectional area of the second region.

15. The device of claim 13 wherein the cross-sectional area of the intermediate region is at least 40% less than the cross-sectional area of the first region.

16. The device of claim 14 wherein the cross-sectional area of the intermediate region is at least 40% less than the cross-sectional area of the second region.

17. The device of claim 15 wherein the cross-sectional area of the intermediate region is at least 60% less than the cross-sectional area of the first region.

18. The device of claim 16 wherein the cross-sectional area of the intermediate region is at least 60% less than the cross-sectional area of the second region.

19. The device of claim 14 wherein the first and second regions are connected by an intermediate region, the cross-sectional area of the intermediate region being at least 20% less than the cross-sectional area of the first and second regions.

20. A superconductive electrical device operable simultaneously at a relatively higher temperature and at a relatively lower temperature differing by at least 20° K, the device comprising:
   (a) a ceramic substrate having a first relatively higher temperature region and a second relatively lower temperature region;
   (b) a first high temperature superconductive layer on the first region and on a portion of the second region of the substrate, the first layer being superconductive at the relatively higher temperature;

(c) a dielectric layer on the first superconductive layer;

(d) a second low temperature superconductive layer on the second region of the substrate and on a portion of the dielectric layer, the second layer being superconductive at the relatively lower temperature and being non-superconductive at the relatively higher temperature;

(e) securing means for securing at least one integrated circuit chip on at least one of the superconductive layers; and (f) an integrated circuit chip secured to at least one of the layers by the securing means.

21. The device of claim 20 wherein each superconductive layer has one integrated circuit chip secured thereto.

22. The device of claim 20 comprising an electrically conductive, metal, interconnect layer directly connecting the first and second superconductive layers.

23. The device of claim 20 including a ground plane under the substrate.

24. The device of claim 20 wherein the first and second regions are connected by an intermediate region, the cross-sectional area of the intermediate region being at least 20% less than the cross-sectional area of the first region.

25. The device of claim 20 wherein the first and second regions are connected by an intermediate region, the cross-sectional area of the intermediate region being at least 20% less than the cross-sectional area of the second region.

26. A superconductive electrical device operable simultaneously at a relatively higher temperature and at a relatively lower temperature differing by at least 20° K, the device comprising:

(a) a non-superconductive substrate having a first relatively higher temperature region and a second relatively lower temperature region;

(b) at least one bilayer on the first region and on a portion of the second region of the substrate, the bilayer comprising a lower first superconductive layer and an upper non-superconductive layer, the first layer being superconductive at the relatively higher temperature; and (c) a second superconductive layer on the second region of the substrate and on a portion of the outermost bilayer, the second layer being superconductive at the relatively lower temperature but not at the relatively higher temperature.

27. The device of claim 26 wherein the substrate is ceramic.

28. The device of claim 26 including a ground plane under the substrate.

29. The device of claim 26 wherein both the outermost first superconductive layer and the second superconductive layer have an integrated circuit chip secured thereto.

30. The device of claim 26 wherein the upper non-superconductive layer is a dielectric layer.

31. The device of claim 30 comprising a plurality of bilayers, and wherein the upper non-superconductive layers are dielectric layers.

32. A superconductive electrical device operable simultaneously at a relatively higher temperature and at a relatively lower temperature differing by at least 20° K, the device comprising:

(a) a non-superconductive substrate having a first relatively higher temperature region and a second relatively lower temperature region;

(b) at least one bilayer on the first region and on a portion of the second region of the substrate, the bilayer comprising a lower first superconductive layer and an upper non-superconductive layer, the first layer being superconductive at the relatively higher temperature; and (c) a second superconductive layer on the second region of the substrate and on a portion of the outermost bilayer, the second layer being superconductive at the relatively lower temperature but not at the relatively higher temperature, wherein the first and second regions are connected by an intermediate region, the cross-sectional area of the intermediate region being at least 20% less than the cross-sectional area of the first region.

33. A superconductive electrical device operable simultaneously at a relatively higher temperature and at a relatively lower temperature differing by at least 20° K, the device comprising:

(a) a non-superconductive substrate having a first relatively higher temperature region and a second relatively lower temperature region;

(b) at least one bilayer on the first region and on a portion of the second region of the substrate, the bilayer comprising a lower first superconductive layer and an upper non-superconductive layer, the first layer being superconductive at the relatively higher temperature; and (c) a second superconductive layer on the second region of the substrate and on a portion of the outermost bilayer, the second layer being superconductive at the relatively lower temperature but not at the relatively higher temperature, wherein the first and second regions are connected by an intermediate region, the cross-sectional area of the intermediate region being at least 20% less than the cross-sectional area of the second region.

34. A cryo-cooler with the device of claim 13 or 32 therein, the cryo-cooler having a first relatively higher temperature stage and a second relatively lower temperature stage, the first layer being proximate to the first stage and the second layer being proximate to the second stage.

35. The cryo-cooler of claim 34 comprising integrated circuit chips proximate to both stages, the integrated circuit chips being closer to the two stages than the superconductive layers.

36. The cryo-cooler of claim 35 wherein the integrated circuit chips are in direct contact with the first and second stages for conductive heat transfer.

37. The device of claim 10 wherein the contact resistance between the two superconductive layers is less than 1 ohm for a 100×100 micron contact.

38. The device of claim 1 wherein the contact resistance between the two superconductive layers is less than 1 ohm for a 100×100 micron contact.

* * * * *